United States Patent
Cheng et al.

(10) Patent No.: US 10,121,879 B2
(45) Date of Patent: Nov. 6, 2018

(54) FORMING ODD NUMBER OF FINS BY SIDEWALL IMAGING TRANSFER

(71) Applicant: International Business Machines Corporation, Armonk, NY (US)

(72) Inventors: Kangguo Cheng, Schenectady, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/867,789

(22) Filed: Sep. 28, 2015

(65) Prior Publication Data

US 2017/0092745 A1    Mar. 30, 2017

(51) Int. Cl.
*H01L 29/78* (2006.01)
*H01L 29/66* (2006.01)

(52) U.S. Cl.
CPC .... *H01L 29/66795* (2013.01); *H01L 29/6653* (2013.01); *H01L 29/6656* (2013.01); *H01L 29/7851* (2013.01)

(58) Field of Classification Search
CPC .................................................. H01L 29/785
See application file for complete search history.

(56) References Cited

U.S. PATENT DOCUMENTS

| | | | |
|---|---|---|---|
| 7,829,466 B2 | 11/2010 | Johnson et al. | |
| 7,994,020 B2 | 8/2011 | Lin et al. | |
| 8,354,331 B2 | 1/2013 | Cheng et al. | |
| 8,524,605 B1* | 9/2013 | Chen | H01L 29/00 257/E21.249 |
| 8,525,267 B2 | 9/2013 | Wang et al. | |
| 8,674,413 B1 | 3/2014 | Chi | |
| 8,881,066 B2 | 11/2014 | Shieh et al. | |
| 2013/0285143 A1 | 10/2013 | Oh et al. | |
| 2014/0051247 A1* | 2/2014 | Cheng | H01L 21/0337 438/689 |
| 2014/0231915 A1 | 8/2014 | Leobandung | |
| 2014/0245237 A1* | 8/2014 | Cilingir | G03F 7/70433 716/51 |
| 2015/0102409 A1 | 4/2015 | Cheng et al. | |
| 2015/0132911 A1 | 5/2015 | Wann et al. | |
| 2016/0254191 A1* | 9/2016 | Tseng | H01L 21/823431 438/702 |

* cited by examiner

*Primary Examiner* — Peniel M Gumedzoe
*Assistant Examiner* — Christopher Johnson
(74) *Attorney, Agent, or Firm* — Vazken Alexanian; Michael J. Chang, LLC

(57) ABSTRACT

Techniques for forming an odd number of fins by SIT are provided. In one aspect, a method of forming an odd number of fins by SIT includes the steps of: forming a pad layer on a substrate; forming at least one mandrel on the pad layer; forming a first pair of spacers on opposite sides of the mandrel; forming a second pair of spacers on a side of the first pair of spacers opposite the mandrel; removing the first pair of spacers selective to the mandrel and the second pair of spacers; and patterning the odd number of fins in the substrate using a combination of the mandrel and the second pair of spacers as fin masks. A method of forming a finFET device and a fin device structure are also provided.

16 Claims, 4 Drawing Sheets

FORMING ODD NUMBER OF FINS BY SIDEWALL IMAGING TRANSFER

FIELD OF THE INVENTION

The present invention relates to sidewall imaging transfer (SIT), and more particularly, to techniques for forming an odd number of fins by SIT.

BACKGROUND OF THE INVENTION

Sidewall imaging transfer (SIT) has become widely used in doubling patterning density. For each SIT process, the final patterning is doubled. Performing SIT twice ($SIT^2$) will quadruple patterning density.

An SIT process always results in fins in pairs. However, in some cases it is desired to have an odd number of fins (e.g., some standard cells call for 3-fin field effect transistors (FETs)). Thus, in the conventional SIT process the odd number of fins is usually formed by performing a so-call 'fin cut' process which involves patterning and removing the undesired or 'dummy' fins after forming a sea of fins.

As fin pitch is increasingly scaled, the fin-to-fin space becomes increasingly narrow. Cutting dummy fins without compromising the adjacent device fins becomes extremely difficult, if not impossible.

Therefore, there is a need for forming an odd number of fins without a fin cut process.

SUMMARY OF THE INVENTION

The present invention provides techniques for forming an odd number of fins by sidewall imaging transfer (SIT). In one aspect of the invention, a method of forming an odd number of fins by SIT is provided. The method includes the steps of: forming a pad layer on a substrate; forming at least one mandrel on the pad layer; forming a first pair of spacers on opposite sides of the mandrel; forming a second pair of spacers on a side of the first pair of spacers opposite the mandrel; removing the first pair of spacers selective to the mandrel and the second pair of spacers; and patterning the odd number of fins in the substrate using a combination of the mandrel and the second pair of spacers as fin masks.

In another aspect of the invention, a method of forming a fin field-effect transistor (finFET) device is provided. The method includes the steps of: forming a pad layer on a substrate; forming at least one mandrel on the pad layer; forming a first pair of spacers on opposite sides of the mandrel; forming a second pair of spacers on a side of the first pair of spacers opposite the mandrel; removing the first pair of spacers selective to the mandrel and the second pair of spacers; patterning an odd number of fins in the substrate using a combination of the mandrel and the second pair of spacers as fin masks; forming a gate over a portion of the fins that serve as a channel region of the finFET device; and forming doped source and drain regions on portions of the fins extending out from the gate.

In yet another aspect of the invention, a fin device structure is provided. The fin device structure includes: at least one first fin array and at least one second fin array patterned in a substrate, wherein the first fin array and the second fin array each comprise an odd number of fins, and wherein a spacing between the first fin array and the second fin array is independent of a fin pitch.

A more complete understanding of the present invention, as well as further features and advantages of the present invention, will be obtained by reference to the following detailed description and drawings.

DETAILED DESCRIPTION OF PREFERRED EMBODIMENTS

Provided herein are sidewall imaging transfer (SIT) techniques for forming odd numbers of fins without a fin cut process. The present techniques are ideally suited for scaled devices with narrow fin-to-fin spacing where performing conventional processes to remove unwanted fins without inadvertently damaging adjacent fins is difficult, if at all possible.

SIT processes advantageously permit patterning at sublithographic dimensions. With conventional SIT processes, a patterned mandrel is typically used to place spacers (i.e., on opposite sides of the mandrel). The mandrel is next removed selective to the spacers. The spacers are then used as fin masks to pattern fins in an underlying substrate. However, as highlighted above, this conventional approach always results in an even number of fins being patterned in the substrate. Namely, each mandrel locates two spacers. Thus, one mandrel results in two fins being patterned in the substrate, two mandrels result in four fins being patterned in the substrate, and so on. When an odd number of fins is desired, additional processing is then needed to remove the unwanted fins. However, as highlighted above, this removal process is very difficult to perform, if at all possible, when the fin-to-fin spacing is very small. For instance, removing a single fin is virtually impossible for devices in the 7 nanometer (nm) mode.

Advantageously, the present techniques permit the production of an odd number of fins using an SIT process without the need for subsequent fin removal. As will be described in detail below, the present techniques generally involve using the mandrel as well as a second pair of spacers as the fin masks. Contrary to conventional process flows, the spacers adjacent to the mandrels are removed.

Figure 1:
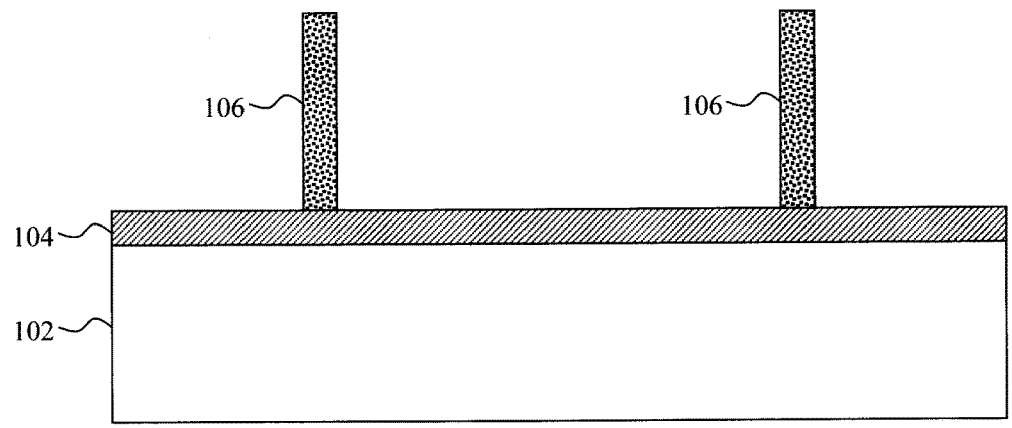
FIG. 1 is a cross-sectional diagram illustrating a starting platform for a sidewall imaging transfer (SIT) process including a substrate, a pad layer on the substrate, and one or more mandrels having been formed on the pad layer according to an embodiment of the present invention.

As shown in FIG. 1, the present process begins with a given substrate 102 into which an odd number of fins will be patterned. The substrate 102 can include a variety of different semiconductor wafer configurations. For instance, suitable substrate materials include, but are not limited to, silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof. According to an exemplary embodiment, the substrate 102 is a bulk semiconductor (e.g., Si, SiGe, etc.) wafer. Alternatively, the substrate 102 can be a silicon-on-insulator or SOI wafer. As is known in the art, an SOI wafer includes a SOI layer separated from a substrate (e.g., a semiconductor substrate) by a buried insulator. When the buried insulator is an oxide, it is also commonly referred to as a buried oxide or BOX.

Next, as shown in FIG. 1, a pad layer 104 is formed on the substrate 102. The pad layer 104 serves to protect the substrate 102 during the mandrel and spacer patterning to be performed later in the process. See below. According to an exemplary embodiment, the pad layer 104 is formed from a nitride material, such as silicon nitride (SiN). In that case, the pad layer 104 is also referred to herein as a pad nitride.

One or more mandrels 106 are then formed on the pad layer 104. See FIG. 1. The mandrels 106 can be formed by first blanket depositing a suitable mandrel material onto the pad layer 104, and then patterning the mandrel material into one or more individual mandrels 106. Suitable mandrel materials include, but are not limited to, amorphous silicon (Si) and amorphous carbon. Amorphous Si films can be deposited, for example, using a physical or chemical vapor deposition process. Amorphous carbon films can be deposited, for example, using DC magnetron sputtering. Standard lithography and etching techniques can be employed to pattern the mandrels. For instance, as is known in the art, a patterned mask (e.g., a SiN hardmask)—not shown—can be formed on the mandrel material marking the footprint and location of each of the mandrels 106. An etch through the patterned mask can then be performed to pattern the mandrel material into the mandrels 106. Suitable etching processes include, but are not limited to, an anisotropic etching process such as reactive ion etching or RIE. Following the mandrel etch, any remaining portion of the patterned mask can be removed.

During the mandrel etch, the pad layer 104 serves as an etch stop. As provided above, the pad layer 104 can be a pad nitride, and the mandrels 106 can be amorphous silicon or carbon. In that case, a Si or carbon selective RIE process can be employed, stopping on the pad nitride.

Figure 2:
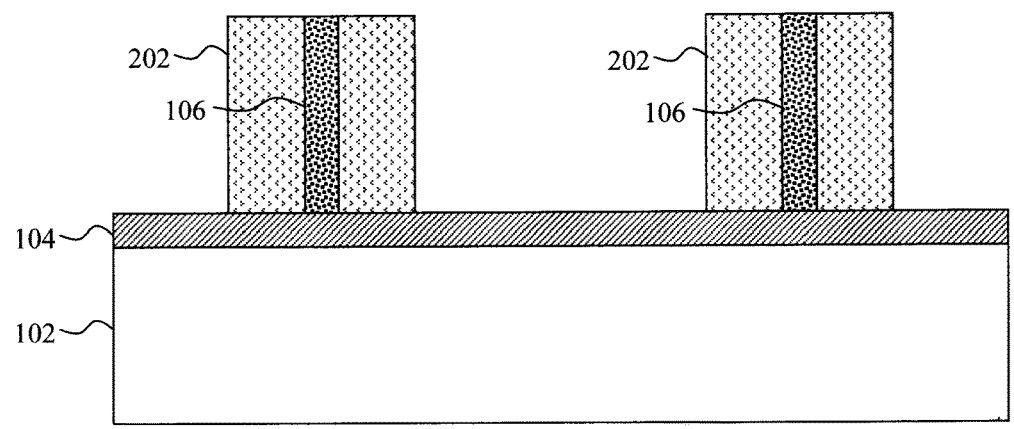
FIG. 2 is a cross-sectional diagram illustrating a first pair of spacers having been formed on opposite sides of the mandrels according to an embodiment of the present invention.

Spacers 202 are next formed on opposite sides of the mandrels 106. See FIG. 2. As highlighted above, the present techniques involve forming a first pair of spacers (which are removed later in the process) and a subsequent second pair of spacers that, along with the mandrels 106 are used to pattern the fins in the substrate 102. It is the first pair of spacers that is now described by way of reference to FIG. 2.

According to an exemplary embodiment, the spacers 202 are formed from an oxide material, such as silicon dioxide (SiO$_2$). This is however merely an example. What is important is that the (first) spacers 202 can be removed selective to the mandrels/second spacers (see below). As provided above, the mandrels 106 can be formed from amorphous Si or carbon. As will be described below, the second pair of spacers can also be formed from amorphous Si or carbon. Thus, in that case, forming the first pair of spacers 202 from an oxide material would be a suitable choice, since the spacers 202 could be removed using an oxide-selective etch.

The spacers 202 can be formed by first depositing a suitable spacer material, and then using standard lithography and etching techniques to pattern the spacer material into the individual spacers 202 on opposite sides of the mandrels 106. As provided above, a suitable spacer material includes, but is not limited to, SiO$_2$. SiO$_2$ can be deposited onto the wafer using, for example, a chemical vapor deposition (CVD) process, and then patterned using an oxide-selective etch, such as an oxide-selective RIE.

The spacers 202 are used to locate a second pair of spacers 302. See FIG. 3. As highlighted above, it is these second pair of spacers 302 that, along with each mandrel 106, are used to pattern the (odd number) of fins in the substrate 102. Specifically, once the (first) spacers 202 are removed (see below), each one mandrel 106 will have two of the second spacers 302 associated therewith. Thus, for each mandrel there will be three fin masks formed (i.e., the mandrel plus two of the second spacers 302).

Figure 3:
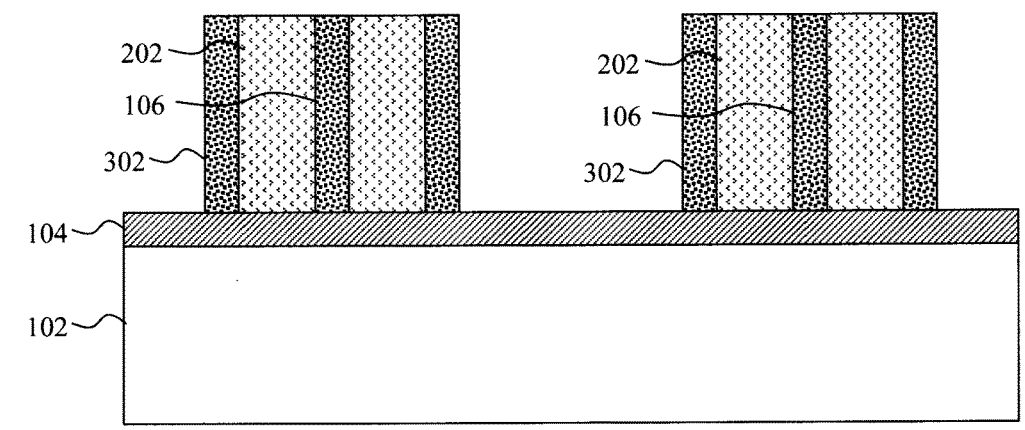
FIG. 3 is a cross-sectional diagram illustrating a second pair of spacers having been formed on a side of the first pair of spacers opposite the mandrels according to an embodiment of the present invention.

As shown in FIG. 3, spacers 302 are formed on opposite sides of the mandrel 106/spacers 202 structures. More specifically, the spacers 302 are formed on a side of the spacers 202 opposite the mandrels 106. As highlighted above, one consideration is that the spacers 202 can be removed selective to the mandrels 106 and the spacers 302. As also provided above, the spacers 302 can optionally be formed from the same material as the mandrels 106, i.e., amorphous Si or carbon. This is however not a requirement but merely an example. For instance, the mandrels 106 can be formed from amorphous carbon while the spacers 302 are from amorphous Si, or vice versa. The same process described above for forming the mandrels 106 may be used here for forming the spacers 302. As provided above, the pad layer 104 serves to protect the substrate 102 during this spacer formation process.

Figure 4:
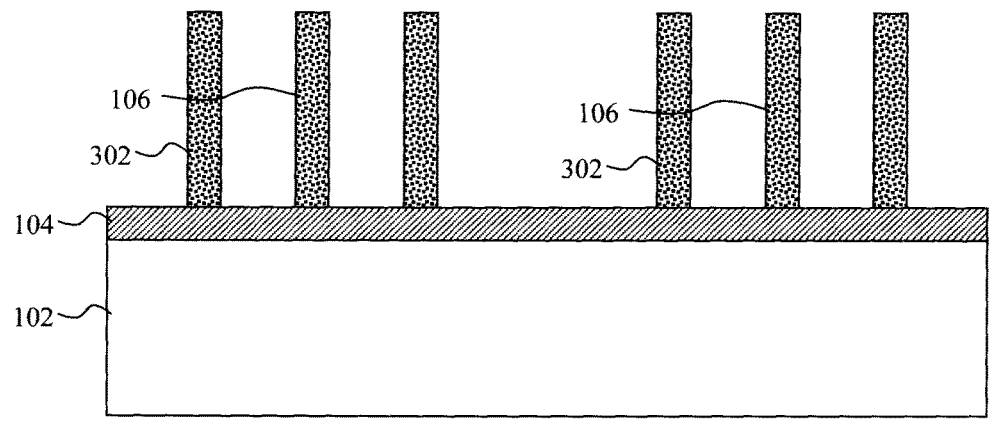
FIG. 4 is a cross-sectional diagram illustrating the first pair of spacers having been removed selective to the mandrels and the second pair of spacers according to an embodiment of the present invention.

The first spacers 202 are then removed selective to the mandrels 106 and the second spacers 302. See FIG. 4. As a result, there are now three fin masks present on the substrate 102 for every mandrel 106 originally patterned. Namely, as shown in FIG. 4 there is now a mandrel 106 and two spacers 302 for each mandrel originally patterned on the substrate 102. Notably, there is now an odd number of fin masks present which, in turn, can be used to pattern an odd number of fins in the substrate. Advantageously, one does not have to go back after patterning an even number of fins and selectively remove individual fins.

The first spaces 202 can be removed using a selective etching process. For instance, as provided above, the first spacers 202 can be formed from an oxide material. In that case, an oxide-selective etch such as an oxide-selective RIE can be used to remove the first spacers 202 selective to the mandrels 106 and the second spacers 302. The pad layer 104 will protect the substrate 102 during this spacer removal step.

Figure 5:
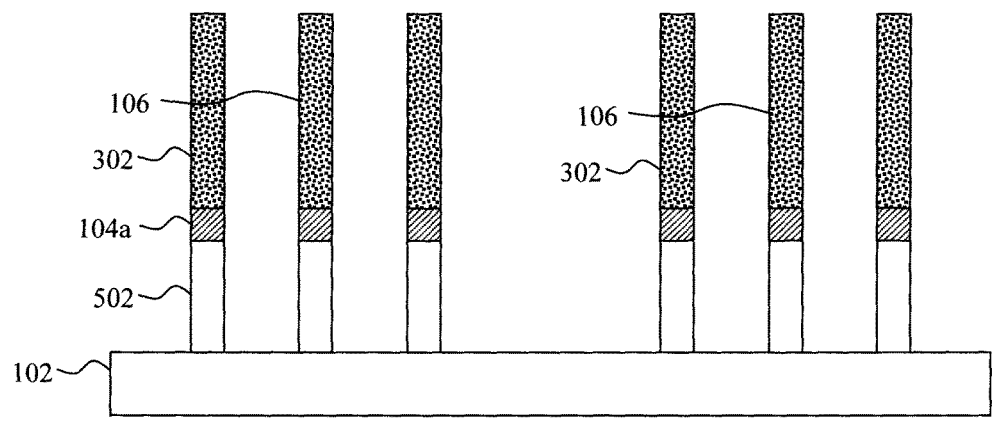
FIG. 5 is a cross-sectional diagram illustrating the mandrels and the second spacers having been used as fin masks to pattern fins in the substrate according to an embodiment of the present invention.

The mandrels 106 and the second spacers 302 can then be used as fin masks to pattern fins 502 in the substrate 102. See FIG. 5. The pad layer 104 is present on the substrate 102 (in between the substrate 102 and the fin masks), thus a multi-step etching process may be employed. By way of example only, when the pad layer 104 is a pad nitride and the substrate 102 is a bulk Si wafer (see above) one might first use a nitride-selective etching process to transfer the fin mask pattern to the pad layer 104. Post-patterning, the pad layer is given the reference numeral 104a. A second etch step may then be used to transfer the pattern from the fins masks and patterned pad layer 104a into the substrate 102, forming the fins 502 in the substrate 102. As shown in FIG. 5, the fin etch into the substrate 102 can be endpointed when the etch reaches a certain depth. One skilled in the art would be able to perform a timed etch to reach a certain depth within a wafer. According to an exemplary embodiment, the fin etch through the pad layer 104 and the substrate 102 is performed using a sequence of RIE steps with varying etch chemistries for the various layers.

Alternatively, as provided above, the substrate 102 may be a SOI wafer. In that case, the buried insulator can serve as an etch stop during the fins etching process. The buried insulator will also serve to isolate the fins in the completed device.

Depending on the particular device being fabricated, it may be desirable to remove the fin masks post-fin patterning. For instance, in the example provided below, the patterned fins 502 will be used in the formation of fin field effect transistor (finFET) devices. In order for the gate to access the top of the fins, it may be desirable to remove the fin masks.

Figure 6:
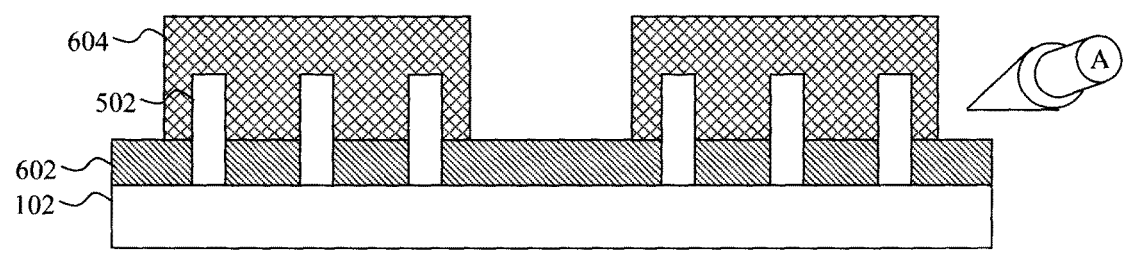
FIG. 6 is a cross-sectional diagram illustrating, in an exemplary process for forming fin field-effect transistor (finFET) devices, a dielectric having been deposited onto the substrate, in between the fins, and one or more gates having been formed over a portion of each of the fins that will serve as channel regions of the finFET devices according to an embodiment of the present invention.

The fin structure fabricated by the above-described process may be used for a variety of different applications. According to an exemplary non-limiting example, the fin structure is used as the basis for forming finFET devices. When starting with a bulk wafer, an isolation region is needed between the fins. For instance, as shown in FIG. 6, a dielectric 602 is deposited onto the substrate 102, in between the fins. According to an exemplary embodiment, the dielectric 602 is an oxide material, such as a conventional shallow trench isolation (STI) oxide.

Figure 7:
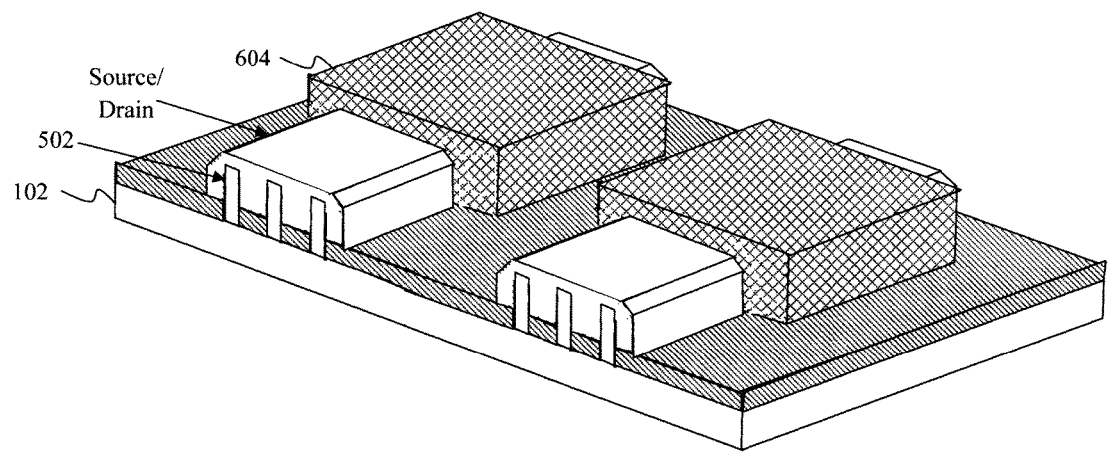
FIG. 7 is a three-dimensional diagram illustrating source and drain regions of the finFET devices having been formed on portions of the fins extending out from the gates according to an embodiment of the present invention.

One or more gates 604 are then formed over a portion of each of the fins 502 that will serve as channel regions of the finFET devices. Source and drain regions of the finFET devices can then be formed on portions of the fins extending out from the gates 604. See, for example, FIG. 7. FIG. 7 provides a three-dimensional view of the fin FET devices from viewpoint A (see FIG. 6). Standard processes may be employed to form the source and drain regions. By way of example only, the source and drain regions may be formed from an in-situ-doped epitaxial material, such as in-situ-doped epitaxial silicon or silicon germanium. Suitable n-type dopants include but are not limited to phosphorous (P), and suitable p-type dopants include but are not limited to boron (B). The use of an in-situ doping process is however only an example. For instance, one may instead employ an ex-situ process such as ion implantation to introduce dopants into the source and drain regions of the finFET devices.

Figure 8:
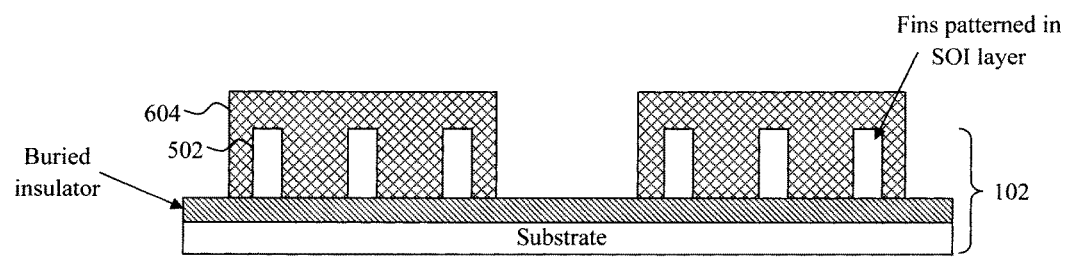
FIG. 8 is a cross-sectional diagram illustrating an alternative embodiment wherein the fins have been patterned in a silicon-on-insulator (SOI) wafer according to an embodiment of the present invention.

Rather than a bulk semiconductor wafer, as provided above the starting substrate 102 may instead have an SOI configuration where the (odd number of) fins are patterned in the SOI layer over a buried insulator. See, for example, FIG. 8. The above-described process for forming the mandrels, spacers, etc. is the same. The only difference is that, in the case of an SOI substrate, isolation of the fins is achieved via the buried insulator. See FIG. 8. Accordingly, one does not need to deposit an additional dielectric post-fin-patterning, i.e., compare FIG. 8 with FIG. 6 (described above).

Figure 9:
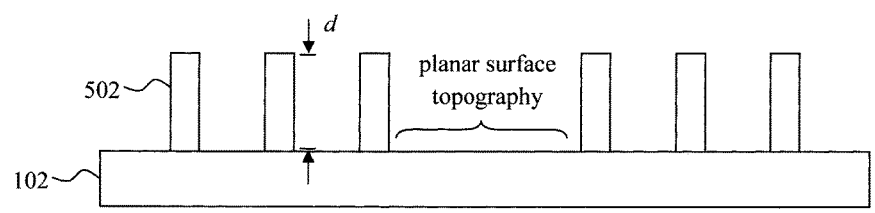
FIG. 9 is a cross-sectional diagram illustrating that the fins patterned via the present process have a uniform depth d and planar surface topography in between the fins according to an embodiment of the present invention.

As described above, the present techniques enable the direct patterning of an odd number of fins, and thus avoid altogether the need to remove individual fins post-fin-patterning. See above. As a result, several distinct structural differences exist between the present fin structures and those resulting from conventional processes. For instance, the fins patterned via the present process have a uniform depth d and planar surface topography in between the fins. See, for example, FIG. 9. Namely, since the present process enables the direct patterning of an odd number of fins at the same time, the fins can be etched to a uniform depth within the substrate 102. By comparison, conventional processes involve patterning an even number of fins, and then selectively removing individual fins to achieve an odd number. The fin removal process inevitably results in a recess in the substrate due to fin cut overetch. Thus, the substrate will have trenches in between the fins that are of non-uniform depths. This is visible as a non-uniform topography between the fins in conventional structures.

Figure 10:
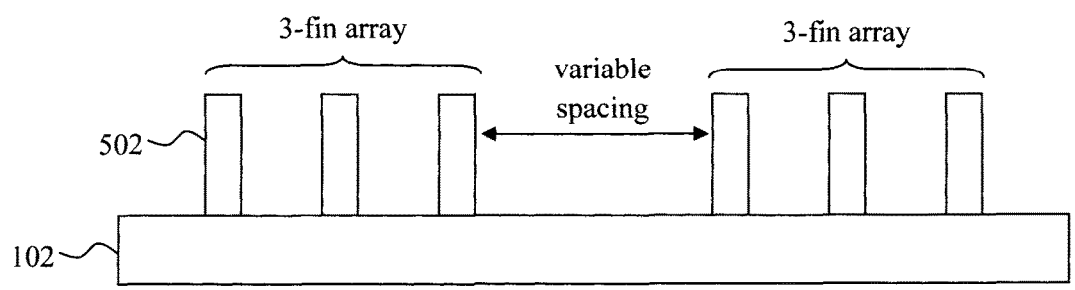
FIG. 10 is a cross-sectional diagram illustrating that the present process can be used to pattern fin arrays with a variable spacing in between the arrays according to an embodiment of the present invention.

Another notable advantage of the present process is that the spacing between fin arrays is variable. For instance, based on the description above, the present process can be used to pattern 3-fin arrays, i.e., based on each mandrel and second pair of spacers as fin masks. The spacing between the 3-fin arrays is variable. Namely, the spacing between the 3-fin arrays is independent of the fin pitch. See FIG. 10. For instance, one could vary the spacing between adjacent arrays simply by varying the spacing between the mandrels. Further, if so desired, the spacing between any two given arrays does not have to be the same as the spacing between two other arrays.

By comparison, with conventional processes where fin removal is used to achieve odd numbered fin arrays, the spacing between arrays is fixed based on the fin pitch. Specifically, creating odd numbered fin arrays by removing a fin(s) results in a spacing between the arrays that is a multiple of the fin pitch. Take for instance a simple example wherein conventional processing is used to produce two 3-fin arrays. One would first fabricate a sea of fins at a given pitch 1×. One would then remove a fin from between two 3-fin arrays. Thus the spacing between these two arrays is at a fixed 2× pitch. No such restrictions are present with the instant process and the spacing between fin arrays is independent of the fin pitch.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an odd number of fins by sidewall imaging transfer (SIT), the method comprising the steps of:
    forming a pad layer on a substrate;
    patterning mandrels having a uniform width on the pad layer;
    forming a first pair of spacers on opposite sides of the mandrels;

forming a second pair of spacers on a side of the first pair of spacers opposite the mandrels;

removing the first pair of spacers selective to the mandrels and the second pair of spacers; and patterning fin arrays in the substrate using a combination of the mandrels and the second pair of spacers as fin masks, wherein each of the fin arrays comprises the odd number of fins, wherein a spacing between the fin arrays is variable and independent of fin pitch within the fin arrays such that the spacing between the fin arrays is different from the fin pitch within the fin arrays, wherein the spacing between the fin arrays is based on a spacing between the mandrels as patterned, and wherein the step of patterning the mandrels comprises varying the spacing between the mandrels during the patterning of the mandrels to vary the spacing between the fin arrays.

2. The method of claim 1, wherein the pad layer comprises a pad nitride.

3. The method of claim 1, wherein the substrate comprises a bulk semiconductor wafer.

4. The method of claim 1, wherein the substrate comprises a silicon-on-insulator (SOI) wafer.

5. The method of claim 1, wherein the mandrels are formed from a material selected from the group consisting of: amorphous silicon and amorphous carbon.

6. The method of claim 1, wherein the first pair of spacers is formed from an oxide material.

7. The method of claim 1, wherein the second pair of spacers and the mandrels are formed from a same material selected from the group consisting of: amorphous silicon and amorphous carbon.

8. The method of claim 1, wherein the second set of spacers is formed from a material selected from the group consisting of: amorphous silicon and amorphous carbon.

9. The method of claim 1, wherein a positioning of the mandrels patterned on the pad layer is such that the second pair of spacers are spaced apart from one another.

10. A method of forming a fin field-effect transistor (finFET) device, the method comprising the steps of:

forming a pad layer on a substrate;

patterning mandrels having a uniform width on the pad layer;

forming a first pair of spacers on opposite sides of the mandrels;

forming a second pair of spacers on a side of the first pair of spacers opposite the mandrels;

removing the first pair of spacers selective to the mandrels and the second pair of spacers;

patterning fin arrays in the substrate using a combination of the mandrels and the second pair of spacers as fin masks, wherein each of the fin arrays comprises the odd number of fins, wherein a spacing between the fin arrays is variable and independent of fin pitch within the fin arrays such that the spacing between the fin arrays is different from the fin pitch within the fin arrays, wherein the spacing between the fin arrays is based on a spacing between the mandrels as patterned, and wherein the step of patterning the mandrels comprises varying the spacing between the mandrels during the patterning of the mandrels to vary the spacing between the fin arrays;

forming a gate over a portion of the fins that serve as a channel region of the finFET device; and forming doped source and drain regions on portions of the fins extending out from the gate.

11. The method of claim 10, wherein the substrate comprises a bulk semiconductor wafer, the method further comprising the step of:

depositing a dielectric onto the substrate, in between the fins, to form an isolation region between the fins.

12. The method of claim 10, wherein the substrate comprises a SOI wafer, and wherein the fins are patterned in an SOI layer of the SOI wafer.

13. The method of claim 10, wherein the mandrels are formed from a material selected from the group consisting of: amorphous silicon and amorphous carbon.

14. The method of claim 10, wherein the first pair of spacers is formed from an oxide material.

15. The method of claim 10, wherein the second pair of spacers and the mandrels are formed from a same material selected from the group consisting of: amorphous silicon and amorphous carbon.

16. The method of claim 10, wherein the second set of spacers is formed from a material selected from the group consisting of: amorphous silicon and amorphous carbon.

* * * * *